United States Patent

Pascucci

[11] Patent Number: 6,046,619
[45] Date of Patent: Apr. 4, 2000

[54] ASYMMETRICAL PULSIVE DELAY NETWORK

[75] Inventor: Luigi Pascucci, Sesto San Giovanni, Italy

[73] Assignee: STMicroelectronics S.r.l., Agrate Brianza, Italy

[21] Appl. No.: 08/900,424

[22] Filed: Jul. 25, 1997

[30] Foreign Application Priority Data

Jul. 30, 1996 [IT] Italy ................................ MI96A1626

[51] Int. Cl.[7] .................................................. H03H 11/26
[52] U.S. Cl. ......................... 327/262; 327/264; 327/288
[58] Field of Search ................................... 327/262, 263, 327/264, 284, 285, 288

[56] References Cited

U.S. PATENT DOCUMENTS

| | | | |
|---|---|---|---|
| 4,843,265 | 6/1989 | Jiang | 327/262 |
| 5,130,582 | 7/1992 | Ishihara et al. | 327/262 |
| 5,300,837 | 4/1994 | Fischer | 327/262 |
| 5,610,546 | 3/1997 | Carbou et al. | 327/261 |

*Primary Examiner*—Kenneth B. Wells
*Attorney, Agent, or Firm*—Theodore E. Galanthy; Robert Iannucci; Seed IP Law Group PLLC

[57] ABSTRACT

This invention relates to an asymmetrical delay network connected between first and second voltage references and having an input terminal for receiving a trigger signal, and an output terminal. The network is of the type which includes at least one charge control transistor and at least one delay capacitor, connected in series with each other between the first and second voltage references. In particular, the charge control transistor has a control terminal connected to a generator of a constant current, and the output terminal delivers a delay signal which is synchronized to a first edge of the trigger signal. The invention also concerns a constant pulse generator including at least a first and a second of such asymmetrical delay networks.

18 Claims, 8 Drawing Sheets

ASYMMETRICAL PULSIVE DELAY NETWORK

FIELD OF THE INVENTION

This invention relates to an asymmetrical pulsive delay network.

More specifically, the invention relates to an asymmetrical delay network which is connected between first and second voltage references and has an input terminal for receiving a trigger signal, and an output terminal, the network being of the type which comprises at least one charge control transistor and at least one delay capacitor, connected in series with each other between the first and second voltage references.

The invention also relates to a constant pulse generator, connected between first and second voltage references, which has an input terminal, first and second control terminals receiving first and second trigger signals, respectively, and has an output terminal presenting a pulsive output signal.

BACKGROUND ART

As is well known, delay networks are extensively used in most of electronic circuits operated either at low or high voltage levels.

In particular, delay networks are known which employ semiconductor devices implemented with CMOS technology and operated in their saturation range. However, the charge/discharge currents, $I_{sat}$, of such devices—and with them the propagation delays provided by such conventional delay networks—are tied in a quadratic fashion to the supply voltage Vdd by the following relationship:

$$I_{sat}=K*(\tfrac{1}{2})*(Vdd-Vth)^2 \qquad (1)$$

where,

K is a multiplicative constant, and

Vth is a threshold voltage.

It will be appreciated from (1) above that, at high levels of the supply voltage Vdd, these conventional delay networks are too fast, to the point of having the effectiveness of their action compromised. In fact, in applications of noise suppression, for example, conventional delay networks are liable to provide delay in diminishing amounts at high voltages, with resulting reduced filtering capability. Due to the presence of elevated levels of voltage and, therefore, of noise this is where the delay is most needed. Thus, in order to achieve a sufficiently delayed propagation for such delay networks to be useful with high voltage levels the amounts of delay provided thereby must be increased. However, this increase produces unacceptable delays at lower voltage levels.

Accordingly, delay networks are needed which have a propagation delay substantially unaffected by operating conditions, and which is specifically independent of the supply voltage Vdd.

This would further the construction of circuits incorporating delay networks, within the frame of their specifications.

Another pressing demand is for delay networks which provides different propagation responses to the switching edges, rising and falling, of a trigger signal, and produces delay in a controllable fashion.

Of particular interest would be the implementation of an asymmetrical delay network having a controllably delayed propagation with respect to a first edge of the trigger signal and a substantially immediate propagation with respect to a second edge thereof.

An asymmetrical delay network would then be available for the construction of a pulse generator adapted to act upon one edge only of two independent trigger signals.

Conventional pulse generators employ delay networks for setting the pulse duration, this duration also being unsuitable at high voltage levels due to its quadratic dependence on the supply voltage Vdd, as determined by relationship (1) above.

One of the underlying technical problems of this invention is to provide an asymmetrical delay network having a significant delay which is substantially independent of the supply voltage with respect to a first edge of a trigger signal, and which offers immediate and natural propagation at a second edge, thereby overcoming the limitations of conventional delay networks.

SUMMARY OF THE INVENTION

One of the inventive ideas behind this invention is to use, as the delaying element, a capacitor controlled by a transistor of the MOS type and which has a charge/discharge current held substantially constant as the supply voltage varies.

Based on this idea, this technical problem is solved by a delay network as previously indicated being characterized in that said charge control transistor has a control terminal connected to a generator of a constant current, and that said output terminal delivers a delay signal which is synchronized to a first edge of the trigger signal.

The features and advantages of a delay network according to the invention will be apparent from the following detailed description of some embodiments thereof, given by way of non-limitative examples with reference to the accompanying drawings.

DETAILED DESCRIPTION OF THE INVENTION

Figure 1A:
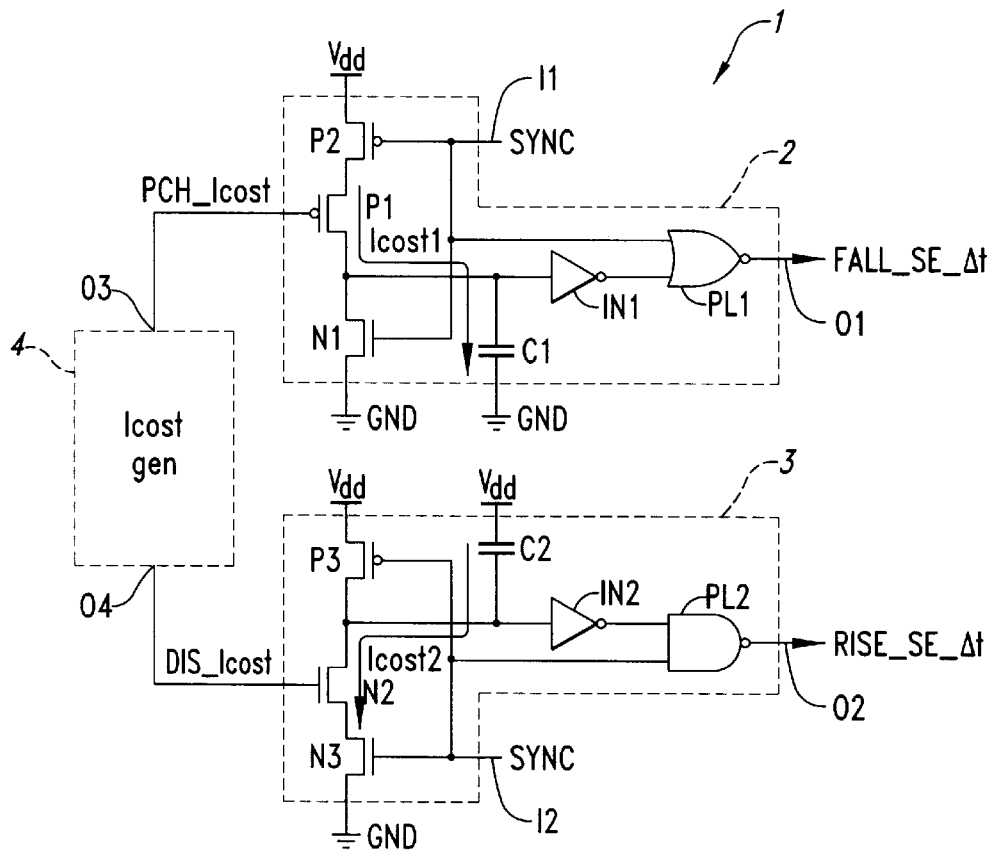
FIG. 1A illustrates first and second delay networks according to the invention, in a first mode of operation thereof.

With reference to the FIG. 1, generally shown at 1 is a delay circuit which comprises first 2 and second 3 delay networks according to this invention.

The first delay network 2 is connected between a first supply voltage reference Vdd and a second voltage reference, specifically a signal ground GND, and has an input terminal I1 and an output terminal O1. In addition, it is connected to a first output terminal O3 of a generator 4 of a constant current.

The second delay network 3 is similarly connected between the supply voltage reference Vdd and the ground GND, has an input terminal I2 and an output terminal O2, and is connected to a second output terminal O4 of the constant current generator 4.

The circuit could include but one of the delay networks, 2 or 3, in which case a constant current generator 4 would be used which has a single signal output for that network.

In particular, said first O3 and second O4 output terminals of the constant current generator 4 respectively deliver first PCH_Icost and second DIS_Icost regulating signals.

The input terminals I1 and I2 of the delay networks 2 and 3 receive a trigger signal SYNC, while the output terminals O1 and O2 respectively deliver first FALL_SE_$\Delta$T and second RISE_SE_$\Delta$T delay signals which are synchronized to a first F1 and a second F2 edge, respectively, of the trigger signal SYNC.

The first delay network 2 comprises a charge control transistor P1 having a source terminal connected, through a first enable transistor P2, to the supply voltage reference Vdd, and having a drain terminal connected toward the ground GND through a parallel of a second enable transistor N1 and a delay capacitor C1. The charge control transistor P1 also has a gate terminal connected to said first output terminal O3 of the constant current generator 4, whereas the enable transistors P2 and N1 receive the trigger signal SYNC on their gate terminals.

In particular, the charge control transistor P1 and first enable transistor P2 are P-channel MOS transistors, whereas the second enable transistor N1 is an N-channel MOS transistor.

The delay capacitor C1 is also connected to a logic inverter IN1 being in turn connected to one input of a logic gate PL1, specifically of the NOR type, which receives the trigger signal SYNC at another input and supplies the first delay signal FALL_SE_$\Delta$T on the output terminal O1 of the delay network 2.

The second delay network 3 similarly comprises a charge control transistor N2, first P3 and second N3 enable transistors, and a delay capacitor C2, as well as a logic inverter IN2 connected to a logic gate PL2, specifically of the NAND type, which supplies the second delay signal RISE_SE_$\Delta$T on the output terminal O2 of the delay network 3.

In a dual manner, the charge control transistor N2 is an N-channel MOS transistor, and the delay capacitor C2 is connected between said charge control transistor N2 and the supply voltage reference Vdd. In particular, the first enable transistor P3 is a P-channel MOS transistor, and the second enable transistor N3 is an N-channel MOS transistor.

Figure 1B:
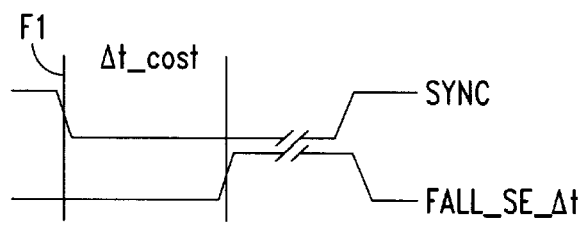
FIGS. 1B and 1C are plots versus time of signals relating to the delay networks of FIG. 1A.
Figure 1C:
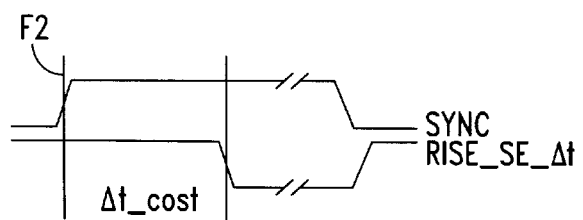

The operation of the delay networks 2 and 3 according to the invention will now be discussed. The timing plots for the trigger signal SYNC, and for the first FALL_SE_$\Delta$T and second RISE_SE_$\Delta$T delay signals, are shown in FIGS. 1B and 1C.

In the presence of a first edge F1, specifically a falling edge, of the trigger signal SYNC, the second delay signal RISE_SE_$\Delta$T immediately (or rather, after a negligible delay due to the switching of the logic elements included in the delay network 3) goes to a high logic level, or level of 1, responsive to the presence of two low logic levels, or levels of 0, at the inputs of the logic gate PL2, while the first delay signal FALL_SE_$\Delta$T remains at its 0 level until a charge current Icost1, flowing through the first delay capacitor C1, brings the input of the logic inverter IN1 to a 0 level, and therefore, the input of the logic gate PL1 to a 1 level, thereby switching the output terminal O1 of the delay network 2 to a level of 0.

Thus, the switching of the first delay signal FALL_SE_$\Delta$T upon the first edge F1 of the trigger signal SYNC will take place after a delay $\Delta$T. This delay is proportional to the charge current Icost1 of the delay capacitor C1 and, therefore, essentially independent of the supply voltage Vdd.

In a like manner, in the presence of a second edge F2, specifically a rising edge, of the trigger signal SYNC, the first delay signal FALL_SE_$\Delta$T will immediately (or rather, after a negligible delay) go to a level of 0, responsive to the presence of two 1 levels at the inputs of the first logic gate PL1, while the second delay signal RISE_SE_$\Delta$T remains at its level of 1 until a discharge current Icost2, flowing through the second delay capacitor C2, brings the input of the logic inverter IN2 to a level of 0 and, therefore, the input of the logic gate PL2 to a level of 1, thereby causing the output terminal O2 of the delay network 3 to be switched to a level of 0.

Here again, the switching of the second delay signal RISE_SE_$\Delta$T upon the second edge F2 of the trigger signal SYNC occurs after a delay $\Delta$T. This delay is proportional to the discharge current Icost2 of the delay capacitor C2 and, therefore, substantially independent of the supply voltage Vdd.

Figure 2A:
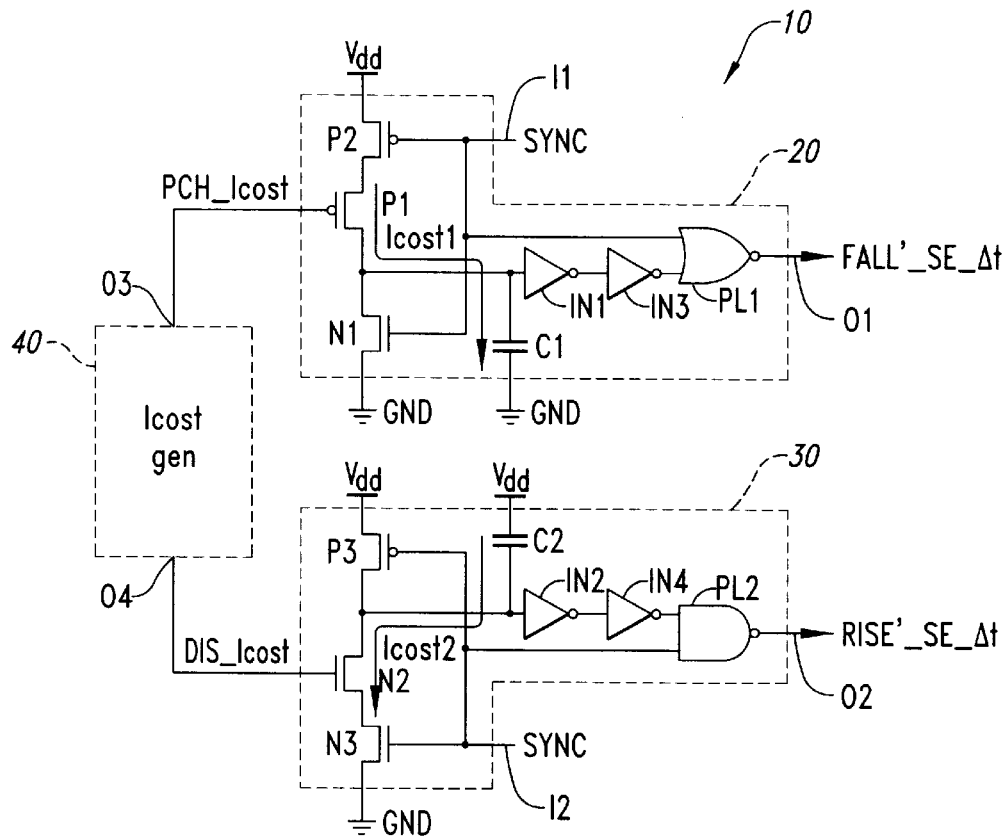
FIG. 2A illustrates first and second delay networks according to the invention, in a second mode of operation thereof.
Figure 2B:
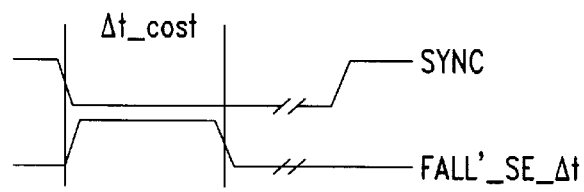
FIGS. 2B and 2C are plots versus time of signals relating to the delay networks of FIG. 2A.
Figure 2C:
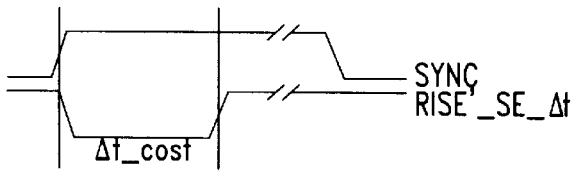

The delay circuit 1 may be modified, as shown in FIG. 2A, into a delay circuit 10 operating in a pulsive mode.

In particular, the delay circuit 10 comprises first 20 and second 30 pulsive delay networks connected between a first supply voltage reference Vdd and a second voltage reference, specifically a ground GND, which networks additionally comprise respective logic inverters IN3 and IN4, connected respectively between the logic inverters IN1, IN2 and the logic gates PL1, PL2. These gates supply first FALL'_SE_$\Delta$t and second RISE'_SE_$\Delta$t delay signals of the pulsive type on the output terminals O1 and O2, respectively.

In fact, the logic inverter IN3 provided additionally in the first pulsive delay network 20 is effective to force a level of 0 on the input of the logic gate PL1. Thus, responsive to a first edge F1, specifically a falling edge, of the trigger signal SYNC, the first pulsive delay signal FALL'_SE_$\Delta$t will go to a level of 1 immediately (or rather, after a trivial delay), and then back to a level of 0 after a delay $\Delta$t tied to the charging of the first delay capacitor C1, while the second pulsive delay signal RISE'_SE_$\Delta$t remains at its 0 level.

Likewise, responsive to a second edge F1, specifically a rising edge, of the trigger signal SYNC, the second pulsive delay signal RISE'_SE_$\Delta$t will go to a level of 0 immediately (or rather, after a trivial delay), and then back to a level of 1 after a delay $\Delta$t tied to the discharging of the second delay capacitor C2, while the first pulsive delay signal FALL'_SE_$\Delta$t remains at its 1 level.

Therefore, the first FALL'_SE_$\Delta$t and second RISE'_SE_$\Delta$t pulsive delay signals are pulsive signals of duration $\Delta$t, both substantially independent of the supply voltage Vdd.

In a fully dual manner, a delay capacitor C11 may be connected within the delay network 2 to the supply voltage reference Vdd (utilizing the charge phenomenon thereof), and a delay capacitor C22 connected to the ground GND (utilizing the discharge phenomenon) in the delay network 3.

The operation of the delay networks 2, 3 and 20, 30 of this invention involves the use of a constant current generator 4 capable of providing first PCH_Icost and second DIS_Icost regulating signals which are substantially constant relative to the supply voltage Vdd.

Figure 3A:
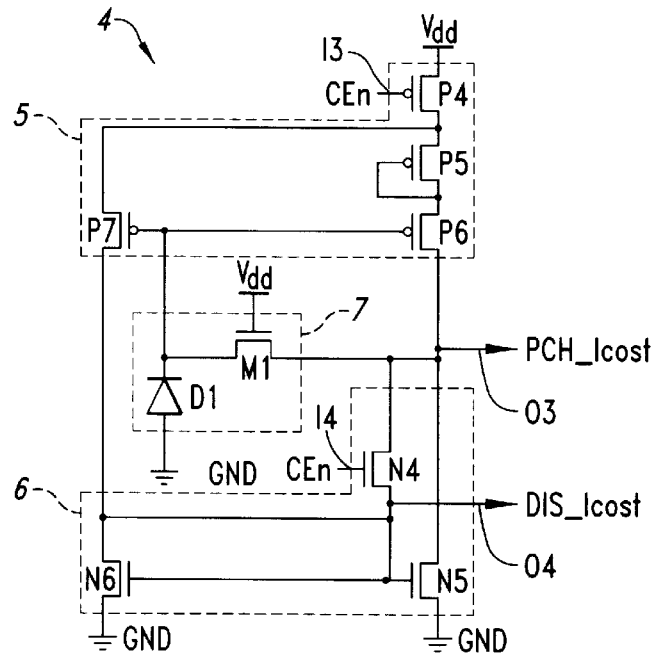
FIGS. 3A and 3B show modified constructions of a portion of the delay networks of FIGS. 1A and 2A.

A current generator 4 of this type is shown in FIG. 3A to comprise of first 5 and second 6 de-coupling blocks connected, in series with each other, between a supply voltage reference Vdd and a second voltage reference, specifically a ground GND.

The first de-coupling block 5 is connected between the supply voltage reference Vdd and the first output terminal O3 of the constant current generator 4, and connected to a first input terminal I3 of the generator 4. The second de-coupling block 6 is connected between the first output terminal O3 of the generator 4 and the ground GND, and connected to a second input terminal I4 and the second output terminal O4 of the constant current generator 4.

Advantageously in this invention, the constant current generator 4 further comprises a safety block 7, connected between the first output terminal O3 of the generator 4 and the ground GND, and connected to the first de-coupling block 5.

As shown in FIG. 3A, the first de-coupling block 5 is implemented, of advantage, by a plurality of P-channel MOS transistors and the second de-coupling block 6 by a plurality of N-channel MOS transistors.

In particular, the first de-coupling block 5 comprises a first enable transistor P4 having a gate terminal connected to the first input terminal I3, a source terminal connected to the supply voltage reference Vdd, and a drain terminal connected to the first output terminal O3, through a series of first P5 and second P6 transistors, as well as to the second de-coupling block 6 through a third transistor P7.

In particular, the first transistor P5 is a diode configuration having the gate and drain terminals connected together and to a source terminal of the second transistor P6. Furthermore, the second P6 and third P7 transistors have their gate terminals in common and connected to the safety block 7.

The second de-coupling block 6 similarly comprises a second enable transistor N4 having a gate terminal connected to the second input terminal I4 of the constant current generator 4, a drain terminal connected to the first output terminal O3, and a source terminal connected to the second output terminal O4 of the constant current generator 4. The second enable transistor N4 also has its source terminal connected to the common gate terminals of fourth N5 and fifth N6 transistors, and to the drain terminal of the fifth transistor N6. In addition, the fourth N5 and fifth N6 transistors have their respective source terminals connected to the ground GND, and their respective drain terminals connected to the drain terminals of the second P6 and third P7 transistors.

The safety block 7 comprises a highly resistive transistor M1, having a gate terminal connected to the supply voltage reference Vdd, a drain terminal connected to the first output terminal O3 of the constant current generator 4, and a source terminal connected to the common gate terminals of the transistors P6 and P7, and to the ground GND through a diode D1.

In a preferred embodiment of the invention, the highly resistive transistor M1 is an N-channel MOS transistor, while the diode D1 can be implemented by an N+ junction on a substrate of the P-type.

The first I3 and second I4 input terminals of the constant current generator 4 receive an enable signal CEn, while the first O3 and second O4 output terminals of the constant current generator 4 deliver the first PCH_Icost and second DIS_Icost regulating signals, respectively.

The operation of the constant current generator 4 according to the invention will now be discussed.

The constant current generator 4 has two stable states, namely an 'off' state and an operational state.

In particular, the absence of the enable signal CEn turns off the enable transistors, forcing the first regulating signal PCH_Icost to the value of the supply voltage Vdd and the second regulating signal DIS_Icost to the value of the ground GND. In this situation, the P-channel transistors and N-channel transistors are all in the 'off' state, and no current is flowing through the constant current generator. Accordingly, no power is consumed.

At power-on, the enable signal CEn applied to the second enable transistor N4 will short-circuit the output terminals O3 and O4 of the constant current generator 4. The safety block 7 therein provides an initial delay for the first de-coupling block 5, and allows proper operation of the constant current generator 4 thus brought to its operational state.

In this operational state, a current will be flowing through the P-channel and N-channel transistors. The first regulating signal PCH_Icost will be following the value of the supply voltage Vdd, while staying below it by an amount twice as large as the threshold voltage of a P-channel transistor (on account of the transistors P5 and P6 provided, the latter being also a diode configuration once the transient is over). On the other hand, the second regulating signal DIS_Icost is tied to a current flowing through the fourth transistor N5, which prevents the second output terminal O4 of the constant current generator 4 from "floating".

Figure 3B:
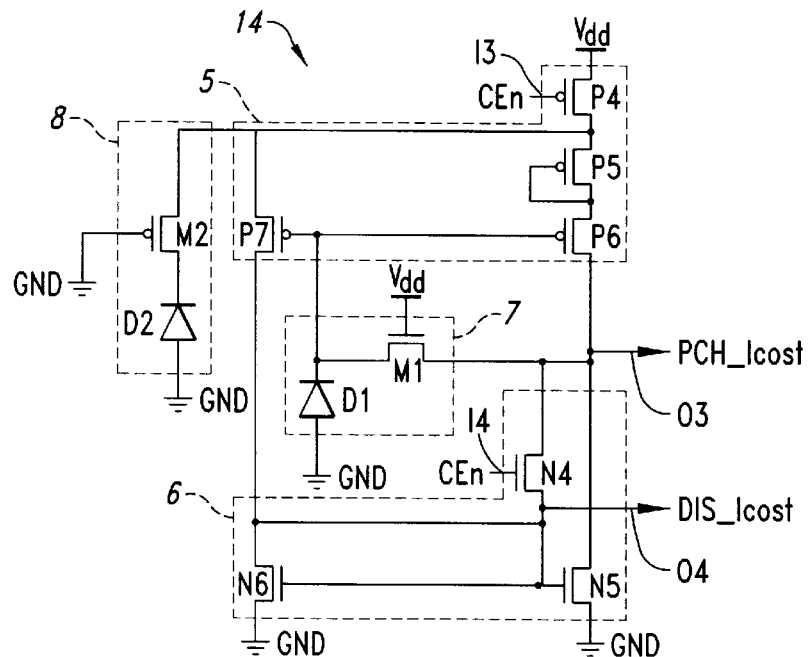

Shown in FIG. 3B is a modified embodiment of a constant current generator 14 according to the invention.

In particular, the constant current generator 14 is derived from the constant current generator 4 by adding a further bias block 8 thereto which is connected between the first de-coupling block 5 and the ground GND and to the second decoupling block 6.

In detail, the bias block 8 comprises a further highly resistive transistor M2 having a source terminal connected to the first de-coupling block 5, specifically to the drain terminal of the first enable transistor P4; a gate terminal connected to the ground GND; and a drain terminal connected to the first 5 and second 6 de-coupling blocks, specifically to the common drain terminals of the third P7 and fifth N6 transistors, and to the ground GND through an additional diode D2.

In a preferred embodiment of the invention, the highly resistive transistor M2 is a P-channel MOS transistor, while the diode D2 can be formed by a diffusion.

The highly resistive transistor M2 therein is effective to bias the fifth transistor N6, forcing the second de-coupling block 6 to current conduction, so that the constant current generator 4 is brought to an operational state in which it can drive any circuits provided downstream of the generator 4.

The regulating signals PCH_Icost and DIS_Icost from the constant current generators, 4 or 14, of this invention are, therefore, substantially independent of the supply voltage Vdd. Advantageously in this invention, it would be possible to use just one of the output terminals of the generator 4 separately, and therefore, but one of the regulating signals PCH_Icost or DIS_Icost.

Thus, the generators 4 or 14 may be advantageously utilized inside delay networks, such as the delay networks 2, 3 or 20, 30 previously discussed, to control the charge current Icost1 and discharge current Icost2 of the delay capacitors C1 and C2 by means of the charge control transistors P1 and N2. Using such generators, substantially constant currents Icost1 and Icost2 can be obtained and the propagation delay of the delay networks 2, 3 or 20, 30 be "frozen".

Actually, the constant current generators 4 and 14 are less than ideal, and the MOS transistors therein change their conductivity as the supply voltage Vdd varies, thereby quickening the delay network propagation at high voltage levels.

This quickening is, however, slight (it being no more than marginally dependent on supply voltage in a linear fashion, rather than quadratically as in conventional delay networks), and is promptly accommodated by the concurrent rise in the tripping threshold of the logic inverters IN1 and IN2 downstream of the delay capacitors C1 and C2, so that a delay ΔT is ultimately obtained which is substantially constant as the supply voltage Vdd varies.

Some preferred embodiments of the constant current generator 4 have been described in relation to FIGS. 3A and 3B that should be accepted as illustrative and non-limitative of the invention, other equivalent embodiments being conceivable for the purpose of obtaining a constant regulating signal.

The use of networks whose delay is substantially independent of the supply voltage Vdd can be of benefit especially to devices operated at high voltages. An exemplary application would be noise filters, vital as they are at high voltage levels when noise is bound to be stronger.

As applied to noise filters for high voltages, the delay networks of this invention can ensure compliance with the filter de-select specifications even at low voltage levels. Thus, the output stage structures of devices operated at high voltages can be augmented, when equipped with such noise filters, to provide faster changeovers and overall speed of the devices.

Advantageously in this invention, a pulse generator adapted to produce an output signal PULSE upon a first edge of two independent trigger signals can be provided using delay networks, particularly of the pulsive type as previously described with reference to FIG. 2A.

Figure 4:
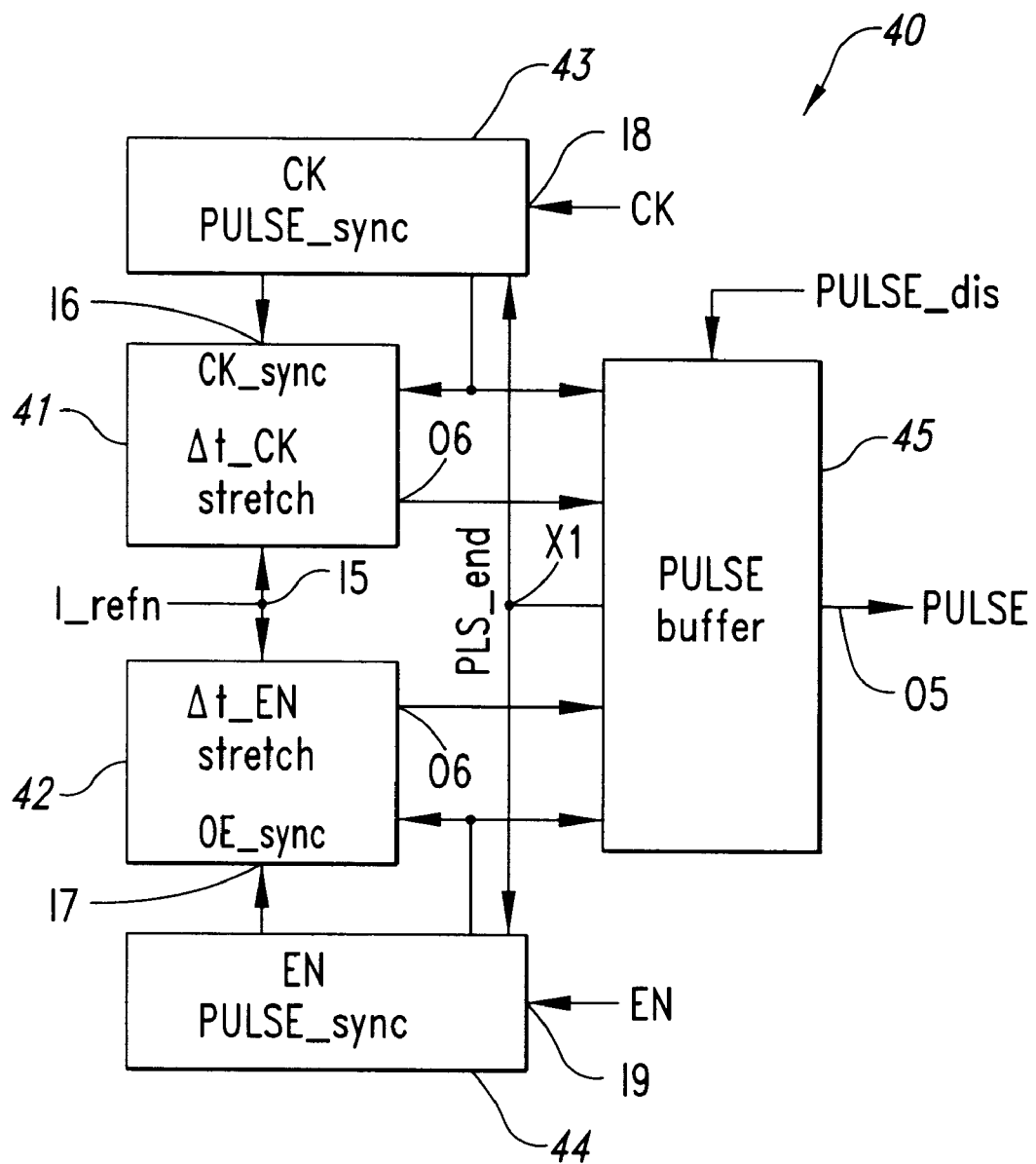
FIG. 4 shows a block diagram of a pulse generator embodying this invention.

A pulse generator according to the invention is shown in a block diagram in FIG. 4, and generally referenced 40 therein. More detailed views of the generator 40 are provided by FIGS. 5A and 6A.

The pulse generator 40 comprises first 41 and second 42 pulsive delay networks, of the kind denoted by 30 in FIG. 2A, which are connected between a supply voltage reference Vdd and a second voltage reference, such as a ground GND. The delay networks 41 and 42 have an input terminal I5 in common, respective control terminals I6 and I7 connected to first 43 and second 44 synchronizing blocks, and respective output terminals O6 and O7 which are connected to an output terminal O5 of the pulse generator 40 through a series of a logic gate 45 and a further de-coupling block 46.

Advantageously in this invention, the input terminal I5 receives a regulating signal DIS_Icost which remains substantially constant as the supply voltage Vdd varies.

Furthermore, the logic gate 45 outputs a control signal PLS_end on an internal circuit node X1, connected to an input of the de-coupling block 46, which receives, on another input I10, an enable signal PULSE_dis.

Finally, the first 43 and second 44 synchronizing blocks have respective input terminals I8 and I9 to receive first CK and second EN trigger signals. The blocks are connected together at the internal circuit node X1 and connected to the output terminal O5 of the pulse generator 40 via the de-coupling block 46.

In particular, the first trigger signal CK is basically a clock signal, whereas the second trigger signal EN functions as an enable signal.

Figure 5A:
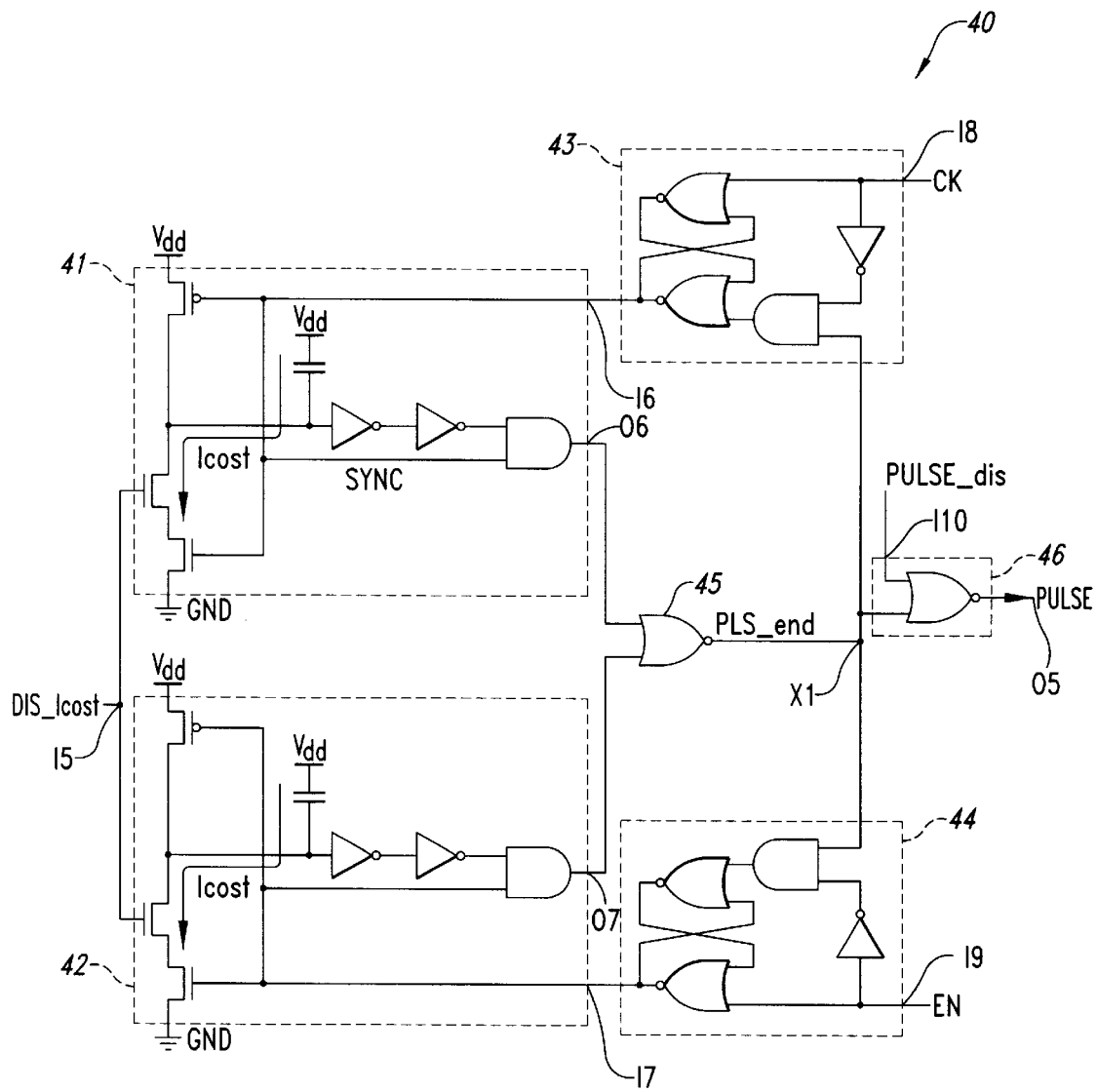
FIG. 5A shows the pulse generator of FIG. 4 in greater detail.

In the embodiment shown in FIG. 5A, the logic gate 45 is of the NOR type, and the synchronizing blocks 43 and 44 are implemented by flip-flops of the SET-RESET type.

In this embodiment, the control terminals I6 and I7 of the delay networks 41 and 42 are, therefore, connected to the natural and negated output terminals, respectively, of the flip-flops 43 and 44.

Finally, the de-coupling block 46 is also simply implemented by a logic gate of the NOR type.

Figure 5B:
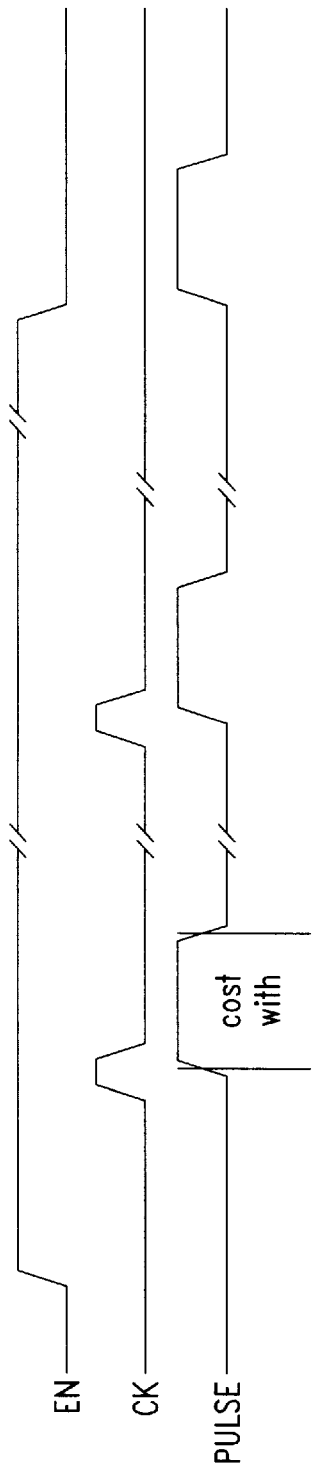
FIGS. 5B and 5C are plots versus time of signals relating to the pulse generator of FIG. 5A.

The operation of the pulse generator 40 of this invention will now be discussed with reference to the plots of the trigger signals CK and EN, and of the output signal PULSE, shown in FIG. 5B.

Assume first that the enable signal EN is at a low logic level, or 0 level. The level of 0 is applied, through the synchronizing block 44, to an input of the logic gate contained in the delay network 42 will disable operation of that delay network 42, forcing a high logic level, or 1 level, on its output terminal O7.

In an initial situation of absence of a clock signal CK, i.e. of the signal CK being at a level of 0, the logic gate contained in the delay network 41 will have an input at a 0 level (because connected, through the de-coupling block 43, to the 0 level of the clock signal CK) and block the output signal PULSE.

When the clock signal goes over to the 1 level, this level of 1 will be quickly passed to the input of the logic gate in the delay network 41, on account of the first enable transistor provided in this network 41 (which transistor should therefore be a large one, that is one of high aspect ratio). Thus, the output signal PULSE will also go to a level of 1.

By contrast, when the clock signal CK goes back to the 0 level, a delay occurs in the propagation of that 0 level through the delay network 41 which is tied to the discharging of the delay capacitor in the network 41.

In fact, the 0 level of the clock signal CK is unable to reset the flip-flop 43 due to the 0 level placed by the signal PLS_end on the internal circuit node X1 (inhibiting the resetting of the flip-flop 43). Under these conditions, the trigger signal SYNC can only go back to its 0 level after the delay capacitor in the first delay network 41 is discharged, that is after the 1 level of the output signal PULSE is depleted.

Figure 5C:
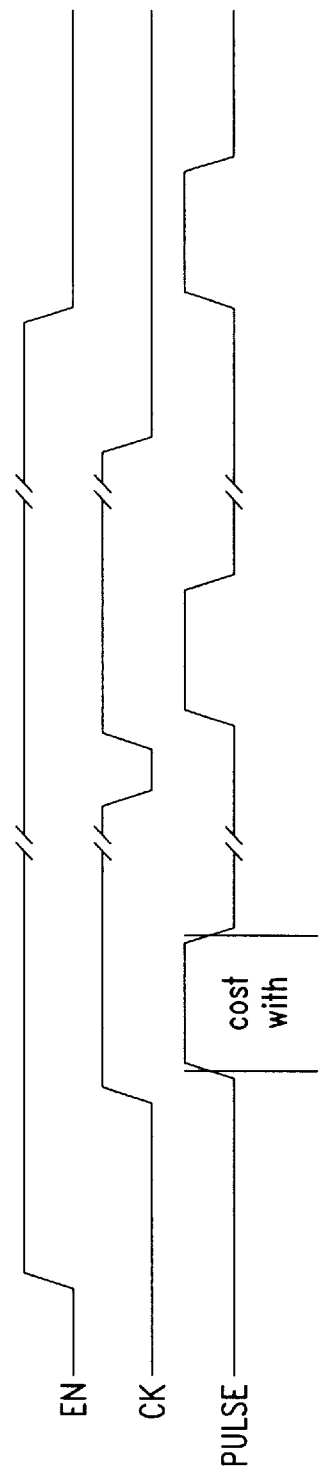

The generator of this invention can also be used where a non-pulsive clock signal CK is provided, as shown in FIG. 5C. In this case, the logic gate contained in the delay network 41 will block the output signal PULSE at the end of the discharge of the delay capacitor contained in the network 41, which discharge brings one input of that logic gate to a 0 level, while a 1 level is maintained at the other input thereof which is tied to the level of 1 of the clock signal CK as extended by the signal SYNC.

Also advantageously in this invention, not even in the instance of a particularly "narrow" clock signal CK (i.e. one having its rising and falling edges close together) is an interruption caused in the pulse of the output signal PULSE, such an interruption being linked to the charge/discharge phenomena of the delay capacitors in the delay networks 41 and 42.

Thus, the non-pulsive character of the clock signal CK will neither affect the behavior of the signal PULSE nor the functionality of the generator 40; an output signal is, therefore, obtained with a pulse duration independent of the duration of the pulses of the clock signal CK.

Finally, the signal PULSE_dis is effective to disable, by means of the de-coupling block 46, the generation of an output signal PULSE and, hence, the operation of the pulse generator 40.

Advantageously in this invention, the generator 40 can produce a pulse even as the generator is being disabled, that is as the enable signal EN goes to a level of 1.

In this case, the second delay network 42 is activated to bring the internal circuit node X1, and accordingly the output signal PULSE, to a 1 level. This 1 level is maintained until the delay capacitor in the delay network 42 is discharged, outputting the pulse sought.

Figure 6A:
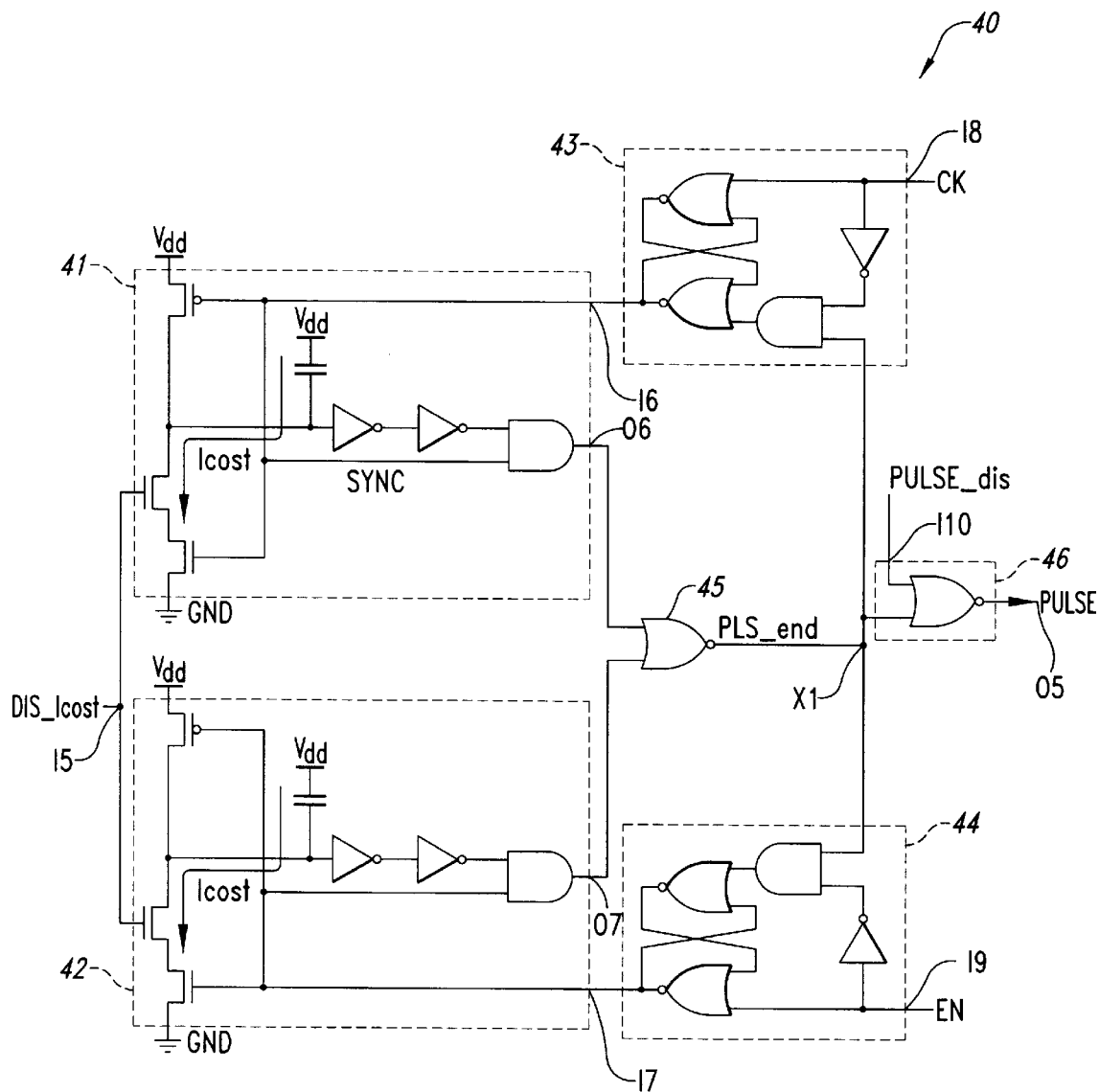
FIG. 6A shows in greater detail a modified embodiment of the pulse generator of FIG. 4.

Thus, the output signal PULSE will present a pulse of constant duration on the occurrence of each pulse of the clock signal CK and the falling edge of the enable signal EN.

Where this pulse tied to the enable signal is not needed, a pulse generator 40' may be used as shown in FIG. 6A.

Figure 6B:
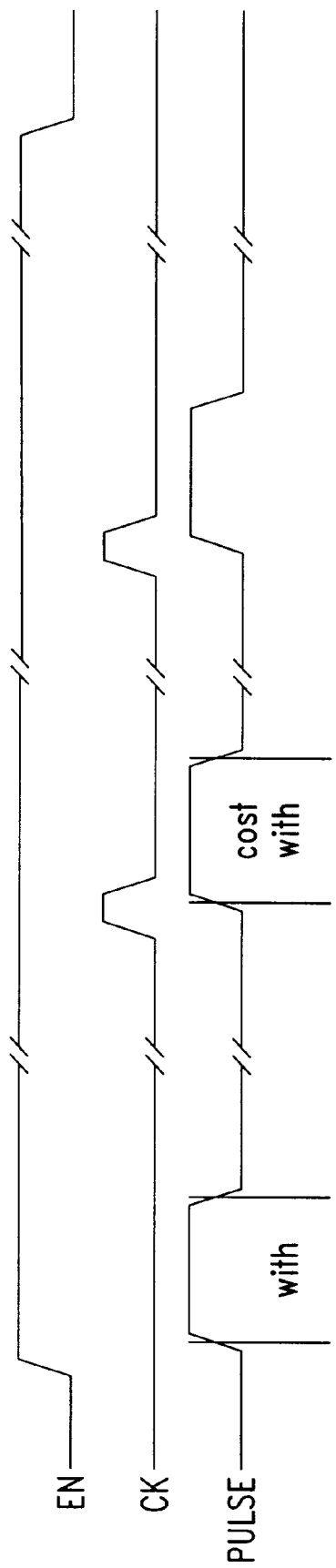
FIG. 6B shows plots versus time of signals relating to the pulse generator of FIG. 6A.

The synchronizing block 44 included in the pulse generator 40' is connected to the input I7 of the second delay network 42 through its negated output. In this way, a 1 level of the enable signal EN presented at the input I9 of the synchronizing block 44 will disable operation of the second delay network 42, bringing the internal circuit node X1 and, hence, the output signal PULSE to a level of 0, as shown in FIG. 6B.

In the embodiment shown in FIG. 5A, the synchronizing block 44 is implemented by a flip-flop of the SET-RESET type. In this embodiment, therefore, the control terminal I7 of the delay network 42 would be connected to the natural output terminal of that flip-flop.

A pulse generator according to the invention can be used to an advantage in the final stages of devices operated at high voltages to prevent perturbation from the switching of such stages. The delay in propagation introduced by the generator of this invention at each clock pulse allows such perturbations, as generated concurrently with the clock signal activating such switching, to be removed by filtering.

What is claimed is:

1. An asymmetrical delay network connected between first and second voltage references and having an input terminal for receiving a trigger signal, and an output terminal, the network including at least one charge control transistor and at least one delay capacitor, connected in series with each other between the first and second voltage references, wherein said charge control transistor has a control terminal connected to a constant current generator, wherein said output terminal delivers a delay signal which is synchronized to a first edge of the trigger signal, and wherein the delay capacitor is connected to the output terminal through a series of first and second logic gates, said second logic gate having one input terminal connected to the input terminal of the asymmetrical delay network.

2. The asymmetrical delay network according to claim 1, further comprising a further logic gate connected between the first and second logic gates, and that the delay signal presented at the output terminal is of the pulsive type.

3. The asymmetrical delay network according to claim 2 wherein the delay signal presents pulses which are synchronized to the first edge of the trigger signal and have a duration which is proportional to a charging or discharging time of the delay capacitor and substantially independent of the first voltage reference.

4. An asymmetrical delay network connected between first and second voltage references and having an input terminal for receiving a trigger signal, and an output terminal the network including at least one charge control transistor and at least one delay capacitor, connected in series with each other between the first and second voltage references, wherein said charge control transistor has a control terminal connected to a constant current generator, wherein said output terminal delivers a delay signal which is synchronized to a first edge of the trigger signal, and wherein the constant current generator comprises first and second de-coupling blocks connected, in series with each other, between the first and second voltage references, and connected together at a first output terminal of the generator delivering a first regulating signal, the signal being substantially constant relative to the first voltage reference, said first and second de-coupling blocks comprising respective pluralities of PMOS and NMOS transistors.

5. The asymmetrical delay network according to claim 4 wherein the constant current generator has first and second input terminals receiving a same enable signal and being connected to said first and said second de-coupling block, respectively.

6. The asymmetrical delay network according to claim 5 wherein the first de-coupling block comprises an enable transistor and first and second transistors connected, in series with one another, between the first voltage reference and the first output terminal of the generator, said enable transistor having a control terminal connected to the first input terminal of the generator and said second transistor having a control terminal connected to a control terminal of a third transistor, the third transistor connected between the enable transistor and the second de-coupling block.

7. The asymmetrical delay network according to claim 5 wherein the second de-coupling block comprises an enable transistor, connected between the first output terminal and a second output terminal of the generator delivering a second regulating signal, and a fourth transistor connected between the first output terminal of the generator and the second voltage reference, said enable transistor having a control terminal connected to the second input terminal of the generator and said fourth transistor having a control terminal connected to the second output terminal of the generator and to a control terminal of a fifth transistor, the fifth transistor connected between the enable transistor and the second voltage reference and connected to the second output terminal of the generator and to the first de-coupling block.

8. The asymmetrical delay network according to claim 4, further comprising a safety block connected between the first output terminal of the generator and the second voltage reference, and connected to the first de-coupling block.

9. The asymmetrical delay network according to claim 4 wherein the constant current generator comprises a bias block connected between the first de-coupling block and the second voltage reference, and connected to the second de-coupling block, said bias block comprising a transistor and a diode connected, in series with each other, between the first de-coupling block and the second voltage reference, said transistor having a control terminal connected to the second voltage reference and said diode being also connected to said second de-coupling block.

10. The asymmetrical delay network according to claim 8 wherein the safety block comprises a transistor and a diode connected, in series with each other, between the first output terminal of the generator and the second voltage reference, said transistor having a control terminal connected to the first voltage reference and said diode being also connected to the first de-coupling block.

11. An asymmetrical delay network connected between first and second voltage references and having an input terminal for receiving a trigger signal, and an output terminal the network including at least one charge control transistor and at least one delay capacitor, connected in series with each other between the first and second voltage references, wherein said charge control transistor has a control terminal connected to a constant current generator, wherein said output terminal delivers a delay signal which is synchronized to a first edge of the trigger signal, and further comprising first and second enable transistors, connected between the charge control transistor and the first and second voltage references, respectively, having a control terminal connected to the input terminal of the asymmetrical delay network.

12. A constant pulse generator, connected between first and second voltage references, and having an input terminal, first and second control terminals receiving first and second trigger signals, respectively, and having an output terminal presenting a pulsive output signal, wherein the generator comprises a first delay network connected between the input terminal and the first control terminal and a second delay network connected between the input terminal and the second control terminal, wherein said delay networks are connected between the first and second voltage references, each delay network having an input terminal for receiving a trigger signal, an output terminal, at least one charge control transistor, and at least one delay capacitor connected in series with each other between the first and second voltage references, wherein said charge control transistor has a control terminal connected to a generator of a constant current, and that said output terminal delivers a delay signal synchronized to a first edge of the trigger signal, and further comprising first and second synchronizing blocks connected between said control terminals and said delay networks and connected together at an internal circuit node, the internal circuit node connected to the output terminal of the pulse generator.

13. The constant pulse generator according to claim 12, further comprising a further de-coupling block, connected between the internal circuit node and the output terminal, having an input terminal to receive an enable signal for the generator.

14. The constant pulse generator according to claim 12 wherein said pulsive output signal is synchronized to at least a first edge of the first and second trigger signals, and wherein the pulsive output signal presents pulses having a duration which is proportional to a charging or discharging time of delay capacitors included in said delay networks and substantially independent of the first voltage reference, and wherein said pulsive output signal is synchronized to a second edge of the second trigger signal.

15. The constant pulse generator according to claim 12 wherein the synchronizing blocks comprise flip-flops of the SET-RESET type having respective natural and negated output terminals connected to said delay networks.

16. A method for creating an asymmetrical delay in an electronic circuit comprising:

obtaining a synchronization signal from an output of a synchronization block having a flip-flop;

monitoring the synchronization signal for a falling transition from a first state to a second state;

upon a falling state transition, charging a capacitor to a value;

sensing a voltage on the capacitor using a first logic gate which changes states when a threshold level is reached;

changing states in a second logic gate when the first logic gate changes states;

transmitting the state of the second logic gate to an output terminal;

monitoring the synchronization signal for a rising transition from the second state to the first state;

upon the rising state transition, discharging a second capacitor to a second value;

sensing a voltage of the second capacitor using a third logic gate which changes states when a second threshold level is reached;

changing state in a fourth logic gate when the third logic gate changes states; and transmitting the state of the fourth logic gate to a second output terminal.

17. The method of claim 16 wherein charging the capacitor requires a longer time period than discharging the second capacitor.

18. An asymmetrical delay network connected between first and second voltage references and having an input terminal for receiving a trigger signal, and an output terminal, the network including at least one charge control transistor and at least one delay capacitor, connected in series with each other between the first and second voltage references, wherein said charge control transistor has a control terminal connected to a constant current generator, wherein said output terminal delivers a delay signal which is synchronized to a first edge of the trigger signal, wherein the delay signal switches, with respect to the first edge of the trigger signal, after a delay which is proportional to a charging or discharging time of the delay capacitor and substantially independent of the first voltage reference, said delay signal also switches, with respect to a second edge of the trigger signal with a negligible amount of delay, and wherein the delay capacitor is connected to the output terminal through a series of first and second logic gates, said second logic gate having one input terminal connected to the input terminal of the asymmetrical delay network.

* * * * *